United States Patent
Higo et al.

(10) Patent No.: US 8,089,802 B2
(45) Date of Patent: Jan. 3, 2012

(54) MEMORY DEVICE AND MEMORY

(75) Inventors: Yutaka Higo, Kanagawa (JP); Minoru Ikarashi, Kanagawa (JP); Masanori Hosomi, Kanagawa (JP); Hiroyuki Ohmori, Kanagawa (JP); Tetsuya Yamamoto, Kanagawa (JP); Kazutaka Yamane, Kanagawa (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 988 days.

(21) Appl. No.: 12/034,461

(22) Filed: Feb. 20, 2008

(65) Prior Publication Data

US 2008/0197433 A1 Aug. 21, 2008

(30) Foreign Application Priority Data

Feb. 21, 2007 (JP) ................... 2007-041500

(51) Int. Cl.
*G11C 11/14* (2006.01)
(52) U.S. Cl. ........ 365/171; 365/158; 365/148; 257/421; 977/933
(58) Field of Classification Search .............. 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/33; 428/810–816, 817–825.1, 428/826; 977/933–935
See application file for complete search history.

(56) References Cited

U.S. PATENT DOCUMENTS

| 5,695,864 | A | 12/1997 | Slonczewski | |
|---|---|---|---|---|
| 6,532,164 | B2 * | 3/2003 | Redon et al. | 365/97 |
| 6,865,109 | B2 * | 3/2005 | Covington | 365/173 |
| 7,009,877 | B1 * | 3/2006 | Huai et al. | 365/171 |
| 7,307,876 | B2 * | 12/2007 | Kent et al. | 365/171 |
| 2003/0007398 | A1 * | 1/2003 | Daughton et al. | 365/200 |
| 2003/0059588 | A1 * | 3/2003 | Hannah et al. | 428/200 |
| 2003/0072174 | A1 | 4/2003 | Savtchenko et al. | |

FOREIGN PATENT DOCUMENTS

| JP | 10-0072174 | 5/1998 |
|---|---|---|
| JP | 2003-017782 | 1/2003 |
| JP | 2005-277147 | 10/2005 |

OTHER PUBLICATIONS

J. Nahas et al., IEEE/ISSCC 2004 Visulas Supplement, p. 22.

* cited by examiner

*Primary Examiner* — Richard Elms
*Assistant Examiner* — Harry W Byrne
(74) *Attorney, Agent, or Firm* — K&L Gates LLP

(57) ABSTRACT

Disclosed is a memory device including a memory layer retaining information thereon based on a magnetization state of a magnetic body, a fixed-magnetization layer having a fixed-magnetization direction formed on the memory layer through a non-magnetic layer, and two metal wiring lines formed adjacent to both ends of the fixed-magnetization layer. In the memory, the magnetization direction of the memory layer is changed by passing an electric current therethrough in a stacked direction to record the information on the memory layer.

6 Claims, 3 Drawing Sheets

MEMORY DEVICE AND MEMORY

CROSS-REFERENCE TO RELATED APPLICATIONS

The present application claims priority to Japanese Patent Application JP 2007-041500, filed in the Japanese Patent Office on Feb. 21, 2007, the entire contents of which are incorporated herein by reference.

BACKGROUND

The present application relates to a memory device including a memory layer storing the magnetization-state of a magnetic body as information, and a fixed-magnetization layer having a fixed-magnetization direction, where the magnetization direction of the memory layer is changed by passing an electric current through the memory layer. The preset application also relates to a memory including such a memory device. The memory device and memory can be suitably applied to a nonvolatile memory.

Information and telecommunication apparatuses, particularly personal small apparatuses, such as personal digital assistances (PDAs), have widely and increasingly been used among consumers. Along with this popularity, enhanced performance, such as higher integration, increased processing speed, and lower consumption of power have been demanded for devices employed in such apparatuses, such as memory and logic devices.

In particular, nonvolatile memories are considered as significant components for enhancement of the performance in such apparatuses.

The nonvolatile memories practically used in the related arts include semiconductor flash memories and ferroelectric nonvolatile memories (Fe-RAMs). These memories have been actively researched and developed for achieving higher performance.

Recently, magnetic random access memories (MRAMs) as nonvolatile memories utilizing tunnel magnetoresistance effects have been disclosed and attracted much attention (e.g., J. Nahas et al., IEEE/ISSCC 2004 Visulas Supplement, p. 22).

The MRAM has a structure having wiring lines, such as a word line and a bit line to regularly arrange minute memory devices for carrying out information-recording and accessing each of the devices. The magnetic memory devices each include a memory layer for recording information as a magnetization direction of a strong magnetic body.

Furthermore, the configuration of the magnetic memory device employs a so-called magnetic tunnel junction (MTJ) structure, which includes the memory layer as described above, a tunnel insulting layer (non-magnetic spacer layer), and a fixed-magnetization layer having a fixed-magnetization direction. The magnetization direction of the fixed-magnetization layer can he fixed by, for example, including a ferromagnetic layer.

The resistance to the tunnel current passing through the tunnel-insulating film change depending on the angle formed by the magnetization direction of the memory layer and the magnetic direction of the fixed-magnetization layer; that is, a so-called tunnel magnetoresistance effect. Accordingly, the information can be written (recorded) using this tunnel magnetoresistance effect. The magnitude of the resistance achieves the maximum when the magnetization direction of memory layer and the magnetization direction of fixed-magnetization layer are not parallel. In contrast, the magnitude of the resistance achieves the minimum when they are in parallel with each other.

In the case of the magnetic memory device formed in this manner, the writing (recording) of information on the magnetic memory device can be carried out by controlling the magnetization direction of the memory layer of the magnetic memory device using synthesis current magnetic field generated on both a word line and a bit line. In general, the different magnetization directions (magnetization-states) are recorded corresponding to information "0" and information "1", respectively.

Furthermore, there is disclosed a method for carrying out the recording (writing) of information on the memory device that utilizes asteroid characteristics (e.g., Japanese Unexamined Patent Application Publication No. 10-116490), or a method using switching characteristics (e.g., U.S. Patent Application No. 2003 0072174 A1).

On the other hand, the recorded information is read out as follows. A memory cell is selected using an element such as a transistor and the tunnel magnetoresistance effect of the magnetic memory device is then used to detect a difference between magnetization directions of the memory layer as a difference in voltage signals, thereby detecting the recorded signal.

When this MRAM is compared with any of other nonvolatile memories, the most significant feature of the MRAM is that the information can be rewritten on the MRAM at a high speed and almost infinitely (>1015 times) because the rewriting of information "0" and information "1" are conducted by reversing the magnetization direction of the memory layer formed of a strong magnetic body.

However, it is preferable to generate a comparatively large current magnetic field in order to rewrite the recorded information in MRAM. A large amount of current (for example, several mA to several tens mA) can be passed through an address line. Thus, power consumption may largely increase.

In addition, the MRAM generally includes both an address line for writing and an address line for reading are respectively required. Thus, it may be difficult to structurally reduce the size of the memory cells.

Furthermore, the reduction in the size of the device may cause some drawbacks; that is, since the address line is thinned, it may be difficult to pass through a sufficient electric current via the address line. In addition, since coercive force increases, current magnetic field may also increase, thereby increasing power consumption.

Therefore, it may be difficult to reduce the size of the device.

However, there are disclosed studies for the structures of recording without using a current magnetic field. Among them, as a study on a memory capable of flux reversal with less current, attentions have been paid on a memory configured to use flux reversal with spin transfer (e.g., U.S. Pat. No. 5,695,864).

The flux reversal with spin transfer indicates that an electron being spin-polarized by passing through a magnetic body is injected into another unfixed-magnetic body to cause flux reversal in the latter magnetic body (e.g., Japanese Unexamined Patent Application Publication No. 2003-17782).

In other words, a spin-polarized electron passed through a magnetic layer (fixed-magnetization layer) with a fixed-magnetization direction is a phenomenon to provide the magnetization of the magnetic layer with a torque when the magnetization direction enters into unfixed-magnetic layer (free magnetization layer) with unfixed-magnetization direction. In addition, passing current through the magnetic layer at a certain threshold or more can reverse the magnetization direction of the magnetic layer (free magnetization layer).

For instance, a giant magnetoresistance effect element (GMR element) or a magnetic tunnel junction element (MTJ element) having a fixed-magnetization layer and a free magnetization layer includes passing an electric current in the direction perpendicular to the film surface of the GMR or MTJ element. As a result, the magnetization direction of at least part of the magnetic layer of the element can be reversed.

In this way, a memory device having a fixed-magnetization layer and a free magnetization layer (memory layer) is formed and the polarity of passage of an electric current through the memory device is then changed to reverse the magnetization direction of the memory layer, thereby rewriting the information "0" and the information "1".

The recorded information can be read out utilizing the tunnel magnetoresistance effect in a manner similar to MRAM by installing a tunnel-insulating layer between the fixed-magnetization layer and the free magnetization layer (memory layer).

Furthermore, the flux reversal with spin transfer has an advantage in that flux reversal can be realized without an increase in electric current.

The absolute value of an electric current, passing through a memory device for flux reversal is 1 mA or less when the memory device is, for example, about 0.1 μm in size. Besides, it is advantageous that an absolute value decrease in proportion to a decrease in volume of the memory device.

Furthermore, there is another advantage in that the configuration of a memory cell can be simplified due to elimination of a recording word line that is necessary in MRA.

Hereinafter, a memory device utilizing a spin transfer will be referred to as a spin transfer random access memory (Sp-RAM). In addition, a spin-polarized current for causing spin transfer will be referred to as a spin injection current.

The Sp-RAM has been greatly expected to be a nonvolatile memory enabling to realize low power consumption and include large storage capacity while maintaining the advantages of MRAM where high-speed performance is obtained and the number of rewritings is almost infinite.

FIG. 1 is a schematic cross sectional diagram of a memory cell of the related-art memory (Sp-RAM) using spin transfer.

For electrically reading out the information stored in the memory cell, a diode, a MOS transistor, or the like may be used. In the memory cell shown in FIG. 1, a MOS transistor is used.

First, the configuration of a memory device 101 forming a memory cell in Sp-RAM will be described.

A ferromagnetic layer 112 and a ferromagnetic layer 114 are linked by an anti-ferromagnetic coupling and arranged through a non-magnetic layer 113. The ferromagnetic layer 112 on the under layer side is arranged contiguous to the ferromagnetic layer 111. An exchange interaction effecting on between these layers has strong unidirectional magnetic anisotropy. Thus, the fixed-magnetization layer 102 includes these four layers 111, 112, 113, 114. In other words, the fixed-magnetization layer 102 includes two ferromagnetic layers 112, 114.

The ferromagnetic layer 116 is formed so that direction of the magnetization M1 may comparatively easily rotate. The memory layer (free magnetization layer) 103 is formed with this ferromagnetic layer 116.

A tunnel-insulating layer 115 is formed between the ferromagnetic layer 114 of the fixed-magnetization layer 102 and the ferromagnetic layer 116, i.e., between the fixed-magnetization layer 102 and the memory layer (free magnetization layer) 103. The tunnel-insulating layer 115 breaks the magnetic coupling between a magnetic layer 116 and a magnetic layer 114 arranged in vertical direction while involving passing a tunnel electric current therethrough. Accordingly, a tunnel magnetoresistance element (TMR) element includes the fixed-magnetization layer 102 with a fixed-magnetization direction of the magnetic layer, the tunnel-insulating layer 115, and the memory layer (free magnetization layer) 103 that may change the magnetization direction.

Furthermore, the above respective layers 111 to 116, a base layer 110, and a top-coating layer 117 form a memory device 101 including a TMR element.

Furthermore, a selection MOS transistor 121 is formed on a silicon substrate 120. A connection plug 107 is formed on one dispersion layer 123 of the selection MOS transistor 121. The base layer 110 of the memory device 101 is connected to the connection plug 107. The base layer 110 of the memory device 101 is connected to the connection plug 107. The other dispersion layer 122 of the selection MOS transistor 121 is connected to a sense line (not shown) through the connection plug 107. A gate 106 is connected to a selection signal line (not shown).

The top-coating layer 117 of the memory device 101 is connected to a bit line (BL) 105 arranged thereon.

In a static state, the magnetization M11 of the ferromagnetic layer 112 and the magnetization M12 of the ferromagnetic layer 114 are almost completely in anti-parallel state by a strong anti-ferromagnetic coupling through the non-magnetic layer 113.

In general, the ferromagnetic layer 112 and ferromagnetic layer 114 have the same saturated magnetization film thickness product. Thus, a leaked component of a magnetic-pole magnetic field is small enough to ignore.

The resistance value of TMR element formed of these layers 114, 115, 116 varies depending on whether the direction of the magnetization M1 of the ferromagnetic layer 116 in the memory layer 103 and the magnetization M12 of the ferromagnetic layer 114 in the fixed-magnetization layer 102 are in a parallel state or in anti-parallel state through a tunnel-insulating layer 115. The resistance value is low when two magnetizations M1. M12 are in a parallel state, while the resistance value is high in anti-parallel state. The resistance of the whole memory device 101 changes as the resistance of the TMR element (114, 115, 116) changes. This factor can be used in the recording of information and the reading-out of the recorded information. In other words, for example, the information "0" may be assigned in the state of low resistance value and the information "1" is assigned in the sate of high resistance value. Thus, the information of two values (one bit) can be recorded.

Notice that among layers forming the fixed-magnetization layer 102, a ferromagnetic layer 114 on the side of the memory layer 103 is a ferromagnetic layer referenced and provided as a reference of the direction of magnetization M1 of the memory layer 103 when the recorded information is read out. Thus, the ferromagnetic layer 114 is also called as a reference layer.

For rewriting the information in the memory cell or reading the information out of the memory cell, a spin-polarized current Iz may be passed through the memory cell. The spin-polarized current Iz passes through the memory device 101, the dispersion layer 123, and the bit line 105.

The spin-polarized current Iz can be changed from the upward to the downward or from the downward to the upward by changing the polarity of the spin-polarized current Iz.

Consequently, the information in the memory cell can be rewritten by changing the direction of the magnetization M1 of the memory layer 103 of the memory device 101.

However, for reversing the magnetization of the memory layer of the memory device, not only does a spin-injection electric current pass through the memory device, but SpRAM also applies a bias-current magnetic field on a memory layer in addition to the memory device (e.g., Japanese Unexamined Patent Application Publication No. 2005-277147).

Specifically, in the configuration of the memory cell shown in FIG. 1, a spin-polarized current Iz is introduced into the memory device 101 through the bit line 105. In addition, a bias-current magnetic field Hx (not shown) generated by the electric current passing through the bit line 105 (equal to the spin-polarized current Iz) is applied on the memory layer 103 of the memory device 101.

Consequently, the direction of the magnetization M1 of the memory layer 103 can be efficiently changed.

SUMMARY

However, in the configuration of the memory device 101 shown in FIG. I, the magnitude of a spin torque activate magnetization Mfree (=M1) of the memory layer (free magnetization layer) 103 is proportional to triple vector product Mfree×Mfree×Mref. Mref is magnetization (=M12) of the reference layer (ferromagnetic layer).

In the initial state, the magnetization Mfree of the memory layer (free magnetization layer) 103 and the magnetization Mref of the reference layer (ferromagnetic layer) 114 is in a parallel state or in anti-parallel state. The first-acting spin torque is very small.

Thus, the less the spin torque decreases, the more the flux reversal current increases.

Therefore, an increase in flux reversal current leads to an increase in spin-polarized current for the reversal of the magnetization direction of the memory layer.

Therefore, the consumption of electric power rewriting the information stored in the memory cell increases the consumption electric power for driving the memory cell.

According to an embodiment of the present invention, there is provided a memory device capable of recording information by reversing the magnetization direction of a memory layer with a small amount of an electric current. The embodiment of the present invention also intends to provide a memory provided with such a memory device.

A first embodiment is a memory device including a memory layer and a fixed-magnetization layer. The memory layer is provided for retaining information thereon based on a magnetization-state of a magnetic body. The fixed-magnetization layer is provided having a fixed-magnetization direction formed on the memory layer through a non-magnetic layer. The magnetization direction of the memory layer is changed by passing an electric current therethrough in a stacked direction to record the information on the memory layer. Two metal wiring lines are formed adjacent to both ends of the fixed-magnetization layer, respectively.

According to the first embodiment, the memory device includes a memory layer for retaining information thereon based on a magnetization-state of a magnetic body. The memory layer includes a fixed-magnetization layer through a non-magnetic layer. Passing an electric current in a stacked direction causes a change in magnetization direction of the memory layer to record the information on the memory layer. Therefore, passing an electric current in a stacked direction can cause a change in magnetization direction of the memory layer by spin injection, thereby attaining the recording of information.

Furthermore, two metal wiring lines are formed adjacent to both ends of the fixed-magnetization layer, respectively. Current magnetic fields from these two metal wiring lines activate the fixed-magnetization layer to generate magnetized components in the different stacked directions in both ends of the fixed-magnetization layer. Therefore, two spin torques having different directions can activate the memory layer by magnetized components in the stacked directions.

A second embodiment is a memory including a memory device. The memory device includes a memory layer and a fixed-magnetization layer. The memory layer is provided for retaining information thereon based on a magnetization-state of a magnetic body. The fixed-magnetization layer is provided having a fixed-magnetization direction formed on the memory layer through a non-magnetic layer. The magnetization direction of the memory layer is changed by passing an electric current therethrough in a stacked direction to record the information on the memory layer. Two metal wiring lines are formed adjacent to both ends of the fixed-magnetization layer. The passages of electric currents in the same direction through the two metal wiring lines respectively form magnetized regions on both sides of a ferromagnetic layer, which is arranged adjacent to at least the memory layer, of the plurality of ferromagnetic layers that form the fixed-magnetization layer. The magnetized regions are magnetized components in the lamination direction and the directions thereof are different.

According to the memory of the second embodiment, the memory layer for retaining information thereon based on a magnetization-state of a magnetic body is provided. Passing an electric current in a stacked direction causes a change in the magnetization direction of the memory layer. The memory includes a memory device for carrying out the recording of information on the memory layer and wiring lines to supply an electric current to pass through the memory device in the stacked direction. In the memory device according to the first embodiment of the present invention, the recording of information can be carried out by spin injection in which an electric current is passed through the wiring lines in the memory device in the stacked direction.

In addition, passing electric currents in the same direction through the two metal wiring lines formed adjacent to both ends of the fixed-magnetization layer lead to the formation of magnetic components in both ends of the ferromagnetic layer in the fixed-magnetization layer. Thus, two spin torques having different directions can activate the memory layer, thereby allowing the information to be recorded with a small amount of an electric current.

According to the aforementioned embodiments of the present invention, information can be recorded on the memory layer with a reduced amount of an electric current by reversing directions of the magnetization of the memory layer.

Consequently, the embodiments of the present invention can provide a memory capable of recording information with small electric power consumption by reducing consumption electric power utilized for the recording.

Additional features and advantages are described herein, and will be apparent from the following Detailed Description and the figures.

BRIEF DESCRIPTION OF THE FIGURES

FIG. 5A illustrates an electric pulse with respect to the spin-polarized current and FIG. 5B illustrates an electric pulse with respect to a metal wiring line.

DETAILED DESCRIPTION

Figure 1:
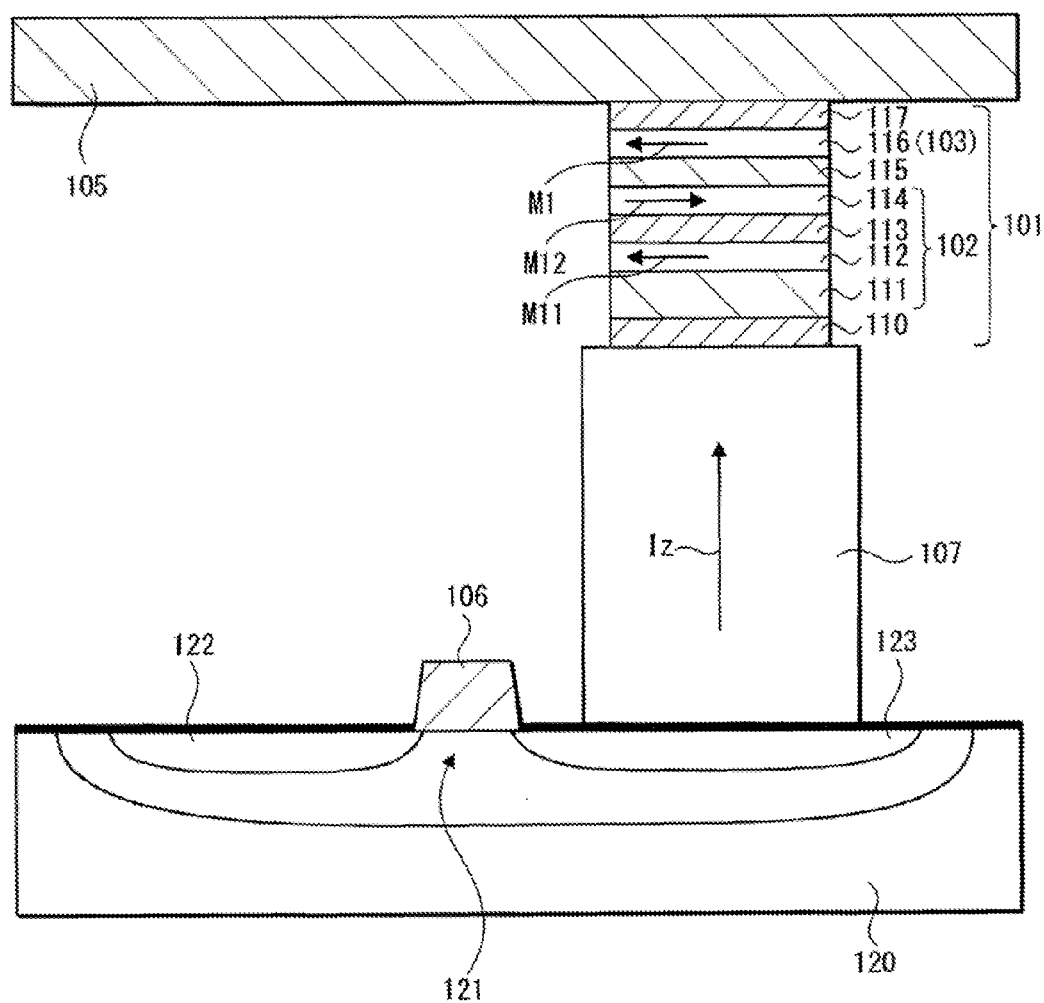
FIG. 1 is a schematic sectional diagram of a related-art memory cell using spin transfer.

The present application will be described below in further detail with reference to the drawings according to an embodiment.

The memory (Sp-RAM) using a spin transfer includes a sufficiently large anisotropy to stabilize the magnetization of the memory layer (free magnetization layer) to heat fluctuation.

Generally, the degrees of the stability in magnetization of the memory layer to the aforementioned heat fluctuation, i.e., the index of thermal stability, can be expressed by a thermal stability parameter ($\Delta$).

In other words, the thermal stability parameter ($\Delta$) is expressed by:

$\Delta = KuV/k_BT$ (Ku; anisotropic energy, V: volume of memory layer, $k_B$: Boltzmann constant, and T: absolute temperature)

Furthermore, it is demanded to secure a certain degree or more of the index of thermal stability (thermal stability parameter) $\Delta$ in the memory (Sp-RAM) used in the spin transfer while lowering a flux reversal electric current.

Thus, various studies have been conducted and the formation of a stable memory can be obtained as follows. A fixed-magnetization layer is formed such that a plurality of ferromagnetic layers are stacked through a non-magnetic layer and anti-ferromagnetically coupled. Then, magnetic regions having magnetized components in the stacked directions, and different magnetizations having different directions are respectively formed on both ends of at least a ferromagnetic layer adjacent to the memory layer.

Furthermore, the magnetic regions respectively having magnetized components in the stacked direction and different magnetizations in different directions are effectively formed on the both ends of the ferromagnetic layer in the fixed-magnetization layer as follows. First, metal wiring lines are arranged adjacent to both ends of the fixed-magnetization layer, and an electric current is then applied on each of the metal wiring lines to activate a current magnetic field on the ferromagnetic layer of the fixed-magnetization layer.

In this case, the magnetic components having mutually different directions in the stacked direction are formed on both ends of the ferromagnetic layer in the fixed-magnetization layer by the application of a current magnetic field. Thus, it is effective to allow the magnetized components in the stacked direction to activate the magnetization of the memory layer.

Furthermore, for forming the magnetized regions respectively having magnetized components in the stacked direction on both ends of the ferromagnetic layer of the fixed-magnetization layer, there is a need of arranging two metal wiring lines in total adjacent to both ends of the fixed-magnetization layer. In addition, for allowing the resulting magnetized regions to have magnetizations in different directions on both ends of the fixed-magnetization layer, two metal wiring lines require the passages of electric currents in the same direction.

The metal wiring line is preferably arranged so that it can be perpendicular to the magnetization direction of the ferromagnetic layer in the fixed-magnetization layer. In addition, the metal wiring line is preferably arranged in a plane parallel to the fixed-magnetization layer.

Two metal wiring lines are applied with electric currents in the same direction, respectively, to generate the respective magnetized components in the stacked direction while directing in different directions. Therefore, two spin torques having different directions may activate both ends of the memory layer from both ends of the magnetic region.

These two spin torques can easily reverse the magnetization direction of the memory layer. Therefore, the magnetization direction of the memory layer can be reversed by a small amount of an electric current.

Subsequently, specific embodiments of the present invention will be described.

Figure 2:
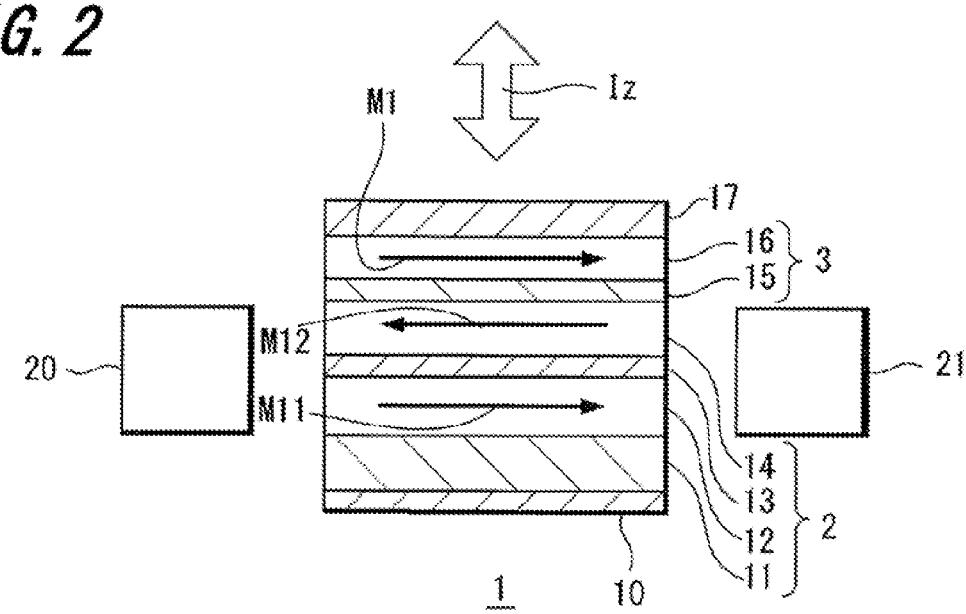
FIG. 2 is a schematic sectional view of a memory device in accordance with an embodiment of the present invention.

FIG. 2 is a schematic sectional view of a memory device according to one embodiment of the present invention.

The memory device 1 includes a tunnel magnetoresistance effect (TMR) element.

In the memory device 1, a ferromagnetic layer 12 and a ferromagnetic layer 14 are arranged through a non-magnetic layer 13 and bonded to each other with an anti-ferromagnetic coupling. Furthermore, the ferromagnetic layer 12 is arranged contiguous to a ferromagnetic layer 11. Here, strong unidirectional magnetic anisotropy can be observed due to an exchange interaction effects between these layers. A fixed-magnetization layer 2 includes these four layers 11, 12, 13, 14, and the fixed-magnetization layer 2 includes two ferromagnetic layers 12, 14.

The ferromagnetic layer 16 is designed to comparatively easily reverse the direction of its magnetization M1. The ferromagnetic layer 16 forms the memory layer (free magnetization layer) 3. The tunnel-insulating layer 15 is formed between the ferromagnetic layer 14 and the ferromagnetic layer 16, i.e., between the fixed-magnetization layer 2 and the memory layer (free magnetization layer) 3. The time-insulating layer 15 breaks the magnetic coupling between a magnetic layer 16 and a magnetic layer 14 arranged in vertical direction while involving the application of a tunnel electric current. Consequently, the tunnel magnetoresistance effect (TMR) element includes the fixed-magnetization layer 2 with a fixed-magnetization direction of the magnetic layer, the tunnel-insulating layer 15, and the memory layer (free magnetization layer) 3 capable of changing a magnetization direction. The memory device 1 having the TMR element includes the above layers 11 to 16, a base layer 10, and a top-coating layer 17.

The strong anti-ferromagnetic coupling through the non-magnetic layer 13 forms the magnetization M11 of the ferromagnetic layer 12 and the magnetization M12 of the ferromagnetic layer 14 in the anti-parallel direction.

The resistance value of the TMR element having these layers 14, 15, 16 varies depending on whether the direction of the magnetization M1 of the ferromagnetic layer 16 of the memory layer 3 and the direction of the magnetization M12 of the fixed-magnetization layer 14 in the fixed-magnetization layer 2 sandwiching the tunnel-insulating layer 15 is in a parallel state or in an anti-parallel state. The resistance value is low when two magnetizations M1, M12 are in a parallel state, while the resistance value is high in an anti-parallel state. The resistance of the whole memory device 1 changes as the resistance of the TMR element (14, 15, 16) changes. This fact can be used in the recording of information and the reading-out of the recorded information. In other words, for example, the information "0" may be assigned to the state of low resistance value and the information "1" is assigned to the sate of high resistance value. Thus, the information of two values (one bit) can be recorded.

Among layers forming the fixed-magnetization layer 2, a ferromagnetic layer 14 on the side of the memory layer 3 is a ferromagnetic layer referenced and provided as a reference of the direction of magnetization M1 of the memory layer 3 when the recorded information is read out. Thus, the ferromagnetic layer 14 is also referred to as a reference layer.

For rewriting the information in the memory cell or reading the information out of the memory cell, it is preferable that a spin-polarized current Iz be passed through the memory device 1.

The spin-polarized current Iz passing through the memory device 1 can be changed from the upward to the downward or from the downward to the upward by changing the polarity of the spin-polarized current Iz.

Consequently, the information in the memory cell can be rewritten by changing the direction of the magnetization M1 of the memory layer 3 of the memory device 1.

The memory device 1 of the present embodiment may be formed in a manner similar to the related-art memory device 101 shown in FIG. 1. That is, the memory device 1 may be connected to a selection MOS transistor formed on a silicon substrate to carry out the reading-out of a memory cell.

In addition, the memory device 1 may be connected to wiring lines and spin-polarized current Iz may flow the memory device 1 through the wiring lines in the stacked direction.

In the memory device 1 of the present embodiment, metal wiring lines 20, 21 are arranged in addition to the above TMR element. In other words, the metal wiring lines 20, 21 are arranged adjacent to the both ends of the fixed-magnetization layer 2 and extends in the normal direction on paper.

The metal wiring lines 20, 21 are designed to flow electric currents in the same direction in the vicinity of the memory device 1.

Furthermore, the metal wiring lines 20, 21 are arranged adjacent to both sides of the memory device 1 but not contacted with the fixed-magnetization layer 2. In addition, each of the metal wiring lines 20, 21 can be placed at a position where the current magnetic field generated is allowed to generate the magnetized component on the fixed-magnetization layer 2 in the stacked direction. For instance, the metal wiring lines may be arranged adjacent to both ends of the fixed-magnetization layer 2 of the memory device 1 extending in the direction perpendicular to the magnetization direction of the fixed-magnetization layer 2 or in the direction parallel to the magnetization direction. In addition, metal-wiring lines can be arranged in a plane in parallel to the fixed-magnetization layer of the memory device 1.

In FIG. 2, when electric current Iz is applied, the magnitude of the spin torque activate the magnetization Mfree (=M1) of the memory layer 3 is proportional to triple vector product Mfree×Mfree×Mref. However, Mref is magnetization (=M12) of the reference layer 14.

In the initial state, the magnetization Mfree of the memory layer 3 and the magnetization Mref of the reference layer 14 are in a parallel state or in an anti-parallel state. The first-acting spin torque is very small. Thus, in this case, the flux reversal current increases.

In the memory device 1 of the present embodiment, the passages of electric currents through the metal wiring lines 20, 21 in the same direction generate magnetized components having mutually different directions are generated on both ends of the ferromagnetic layers 12, 14 in the stacked direction. Furthermore, the generation of magnetized components in the stacked directions leads to an increase in spin torque activating the magnetization M1 of the memory layer 3 while decreasing the flux reversal current.

Here, the metal wiring lines 20, 21 are preferably arranged in a plane parallel to the fixed-magnetization layer 2 of the memory device 1. In addition, the metal wiring lines 20, 21 preferably extend in the direction perpendicular to the magnetization direction of the fixed-magnetization layer 2.

As described above, the metal wiring lines 20, 21 are arranged in a plane parallel to the fixed-magnetization layer 2 and the metal wiring lines 20, 21 and the magnetization direction of the fixed-magnetization layer 2 are perpendicular to each other. Therefore, the current magnetic fields generated around the metal wiring lies 20, 21 can be facilitated to activate the ferromagnetic layers 12, 14 of the fixed-magnetization layer 2. As a result, the magnetized components in the stacked direction can be easily generated. In addition, the magnetized components to be generated in the stacked direction become strong. Thus, the spin torque affecting on the magnetization of the memory layer can be increased. Besides, the flux reversal electric current can be reduced.

The metal wiring lines 20, 21 may be designed so that two independent wiring lines may be formed adjacent to the memory device 1. Alternatively, around the memory device 1, a single wiring line may be divided to provide two metal wiring lines in the vicinity of the memory device 1.

Figure 3:
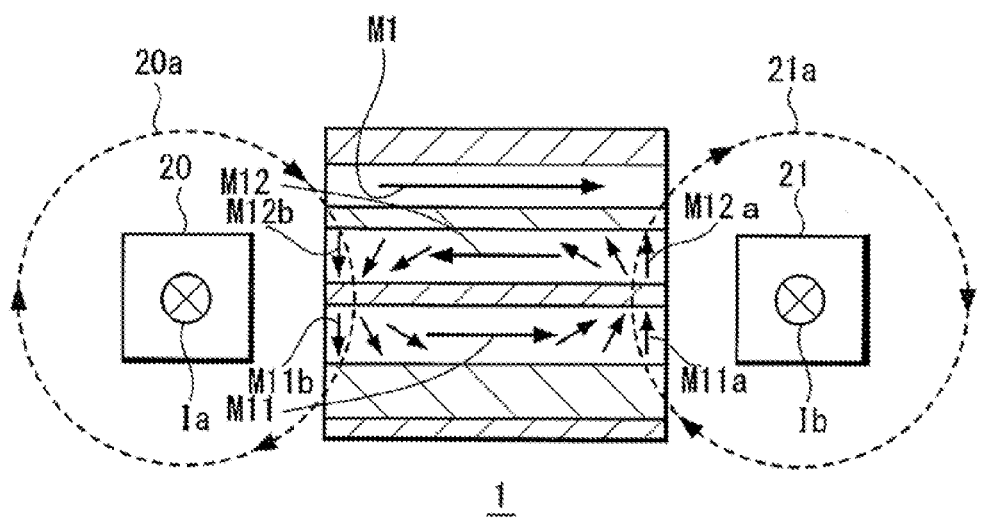
FIG. 3 is a diagram illustrating a magnetized state of the memory device shown in FIG. 1 when the current magnetic fields are applied on the memory device.

Next, FIG. 3 shows a magnetization-state of the fixed-magnetization layer 2 when the electric currents Ia, Ib in parallel are applied on the metal wiring lines 20, 21.

As shown in FIG. 3, when electric currents Ia, Ib are applied in parallel from the front side of the figure to the back side thereof through two metal wiring lines 20, 21, current magnetic fields 20a, 21a are generated around the metal wiring lines 20, 21 clockwise as shown by the dotted lines in FIG. 3.

In this case, the current magnetic fields 20a, 21a inside of the fixed-magnetization layer 2 become synthetic magnetic fields of two current magnetic fields 20a, 201a by two metal wiring lines 20, 21, respectively.

The current magnetic fields 20a, 21a generated by two metal wiring lines 20, 21 tend to gradually decrease as the distance of the current magnetic fields 20a, 2a increases from the metal wiring lines 20, 21. Therefore, the end of the fixed-magnetization layer 2 adjacent to the metal wiring line 20 (left side) is strongly affected by the downward current magnetic field 20a generated by the metal wiring line 20. In contrast, the end of the fixed-magnetization layer 2 adjacent to the metal wiring line 21 (right side) is strongly affected by the upward current magnetic field 21a generated by the metal wiring line 20.

On the other hand, almost in the middle of the fixed-magnetization layer 2, the magnitudes of two current magnetic fields 20a, 21a are almost equal to each other and the directions thereof are opposite to each other. Therefore, the current magnetic fields 20a and 21a compensate each other.

As a result, the magnetization structure in the inside of the fixed-magnetization layer 2 becomes the structure as illustrated in FIG. 3.

In other words, in the fixed-magnetization layer 2, the upward magnetized components M11a, M12a or the downward magnetized components M11b, M12b are generated on both ends of the magnetization M11 of two ferromagnetic layers 12 and both ends of the magnetization M12 of two ferromagnetic layers 14. These upward and downward magnetized components M11a, 11b, M12a, M12b have angles between magnetization direction and the stack direction of the magnetization M11 and the magnetization M12.

The end of the fixed-magnetization layer 2 adjacent to the metal wiring line 20 (on the left side) receives an influence of the downward current magnetic field 20a generated by the metal wiring line 20. Thus, the downward magnetized components M11b, M12b are generated. Furthermore, the end of the fixed-magnetization layer 2 adjacent to the metal wiring line 21 (on the right side) receives an influence from the upward current magnetic field 21a generated by the metal wiring line 21. Thus, the upward magnetized components M11a, M12a are generated. These upward magnetized components M11a, M12a and the downward magnetized components M11b, M12b direct almost opposite to each other on both ends of the fixed-magnetization layer 2.

Furthermore, almost in the middle of the fixed-magnetization layer 2, two current magnetic fields 20a, 21a compensate each other. No magnetized components in the stacked direction are generated.

As described above, the magnetized components in the stacked direction are generated on both sides of the fixed-magnetization layer 2. In particular, of the ferromagnetic layers 12, 14 of the fixed-magnetization layer 2, the magnetization in the stacked direction of the ferromagnetic layer (i.e., the reference layer) 14 adjacent to the memory layer 3 is generated. Thus, the triple vector product Mfree×Mfree× Mref of the aforementioned memory layer 3 to the magnetization M1 can be increased at an initial state.

Therefore, an extremely large spin torque is applied on an extremely narrow region just above the magnetization component in the stacked direction of the ferromagnetic layer 14 of the magnetization M1 of the memory layer 3.

At this time, the fixed-magnetization layer 2 includes too long a distance from the metal wiring lines 20, 21, it may be difficult to generate the magnetized components in stacked direction on both ends of the magnetization M11 of the ferromagnetic layer 12 and the magnetization M12 of the ferromagnetic layer 14. Therefore, a sufficient amount of spin torque for reducing the flux reversal current of the magnetization M1 of the memory layer 3 may not be obtained due to the magnetization generated on both sides of the fixed-magnetization layer 2. Therefore, the metal wiring lines 20, 21 may be arranged at positions at which the current magnetic fields generated to the fixed-magnetization layer 2.

Furthermore, the electric currents to be supplied to the metal wiring lines 20, 21 may be equal to or different from each other. The current magnetic fields from the metal wiring lines 20, 21 activate the ends of the ferromagnetic layers 12, 14, respectively. Then, the magnetized components in the stacked direction may generate spin torques. The magnetized components generated on the ends of the ferromagnetic layers 12, 14 should not be equal to each other.

Figure 4:
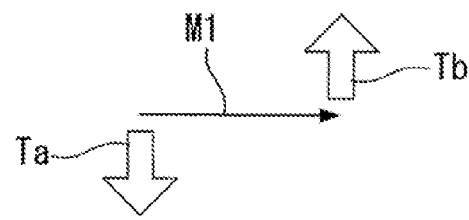
FIG. 4 is a diagram illustrating spin torques applied on the magnetization of the memory layer.

In memory device 1 of FIG. 2, the state of spin torque that is added to the magnetization M1 of the memory layer 3 is shown in FIG. 4. As shown in FIG. 4, spin torques Ta, Tb mutually having opposite directions activate the magnetization M1 of the memory layer 3 from M11 and M12, generated from the magnetized components in the stacked direction, thereby carrying out simultaneous rotation of the magnetization M1 of the memory layer 3.

As a result, the direction of the magnetization M1 of the memory layer 3 cart be easily reversed.

In the present embodiment, the magnetizations with magnetic components in the stacked directions are generated in the ferromagnetic layers 12, 14 of the magnetization-fixed later 2. However, the direction of the magnetization M1 of the memory layer 3 can be controlled by the direction (polarity) of the spin-polarized current Iz just as in the case with the memory device 101.

FIG. 5 illustrates the relationship between the electric current pulses of electric currents Ia, Ib supplied to the metal wiring lines 20, 21 and the time variation (timing) of electric current pulses of pin-polarized current Iz.

In FIG. 5, both the spin-polarized current Iz and the electric currents Ia, Ib supplied to the metal wiring lines 20, 21 are determined as rectangular pulses, respectively. The initial state is set to "0". Also, the rise time of the spin-polarized current Iz and the electric currents Ia, Ib are set to "t1" and "t2", respectively. In addition, the fall time of the spin-polarized current Iz and the electric currents Ia, Ib are set to "t3" and "t4", respectively. The persistence time of each pulse is t3 to t1 for the spin-polarized current Iz and the electric currents Ia, Ib are t4 to t2. The spin-polarized current Iz is in an off-state before t1, in an on-state at t1, and in an off-state at t3.

Figure 5A:
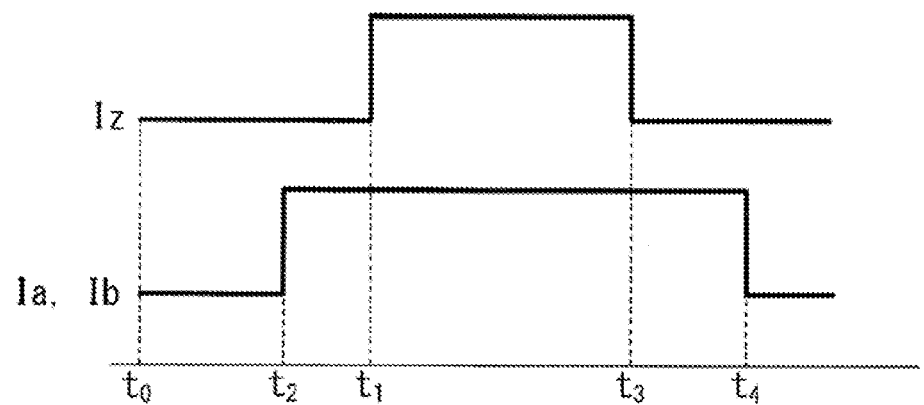
FIG. 5A, 5B are each a diagram illustrating changes of electric current pulses over time, where

In FIG. 5A, the rise lime t1 of the pulse of the spin-polarized current Iz is different from the rise time t2 of the pulse of the electric currents Ia, Ib. In other words, the time t1 is later than the time t2. In addition, in FIG. 5B, the rise time t1 of the spin-polarized current Iz is equal to the rise time t2 of the pulse of the electric currents Ia, Ib.

As shown in FIG. 5A, the rise time t1 of the electric current pulse of the electric currents Ia, Ib is faster than the rise time t1 of the electric current pulse of the spin-polarized current Iz. Thus, the magnetized components in the stacked directions can be generated on both ends of the ferromagnetic layers 12, 14 of the previously feed-magnetization layer 2. Subsequently, the magnetized components in the stacked direction allow spin torques Ta, Tb in opposite directions from each other to activate the magnetization M1 of the memory layer 3. Thus, the direction of the magnetization M1 of the memory layer 3 can be easily reversed. As a result, the flux reversal current can be reduced. Besides, the magnetization direction of memory layer can be reversed by a small amount of an electric current.

Figure 5B:
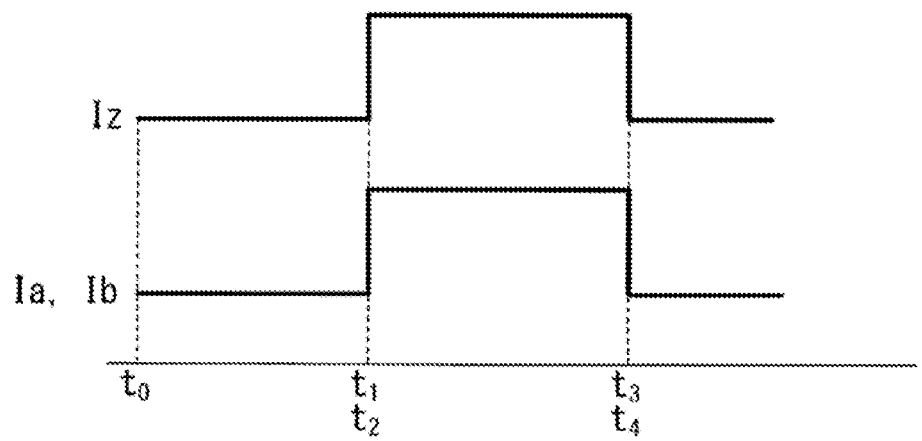

In addition, as shown in FIG. 5B, the rise time t2 of the electric current pulse of the electric currents Ia, Ib is equal to the rise time t1 of the electric current pulse of the spin-polarized current Iz. In addition, the fall time t4 of the electric current pulse of the electric currents Ia, Ib is equal to the fall time t3 of the electric current pulse of the spin-polarized current Iz. In this case, a switching for driving can be standardized. When electric currents Ia, Ib and the spin-polarized current Iz are simultaneously provided, an increase in electric current passing through the electric currents Ia, Ib lead to facilitating the generation of the magnetized components on both ends of the ferromagnetic layers 12, 14 in the stacked direction. Therefore, the direction of the magnetization M1 of the memory layer 3 can be easily reversed. Accordingly, the flux reversal current can be reduced. In addition, the magnetization direction of the memory layer can be reversed by a small amount of an electric current.

The fall time t4 of the electric currents Ia, Ib of the metal wiring lines 20, 21 may be an any arbitrary time. For example, as shown in FIG. 5A, the fall time t4 may be later than the fall time t3 of the spin-polarized current Iz. Alternatively, the fall time t4 may simultaneously end with the fall time t3 of the spin-polarized current Iz.

Furthermore, the angle of the downward spin torque Ta on the left side with respect to the upward spin torque Tb on the right side is almost 180° in FIG. 4. The angle may be controlled depending on the film thicknesses of the ferromagnetic layers 12, 14 of the metal wiring lines 20, 21 or the magnitude of saturated magnetization thereof.

Even though the angle is not around 180° as shown in FIG. 4, the spin torques in opposite directions from each other can activate the magnetization M1 of the memory layer 3 to easily revere the direction of the magnetization M1 of the memory layer 3.

In the present embodiment, the materials of the respective layers forming the memory device 1 may he the same materials as those used in the related-art memory device.

The material of the ferromagnetic layer 11 may be, for example, PtMn.

The material of the ferromagnetic layers 12, 14 of the fixed-magnetization layer 2 may be CoFe or the like. The material of the non-magnetic layer 13 may be Ru, Ta, Cr, Cu, or the like.

The material of the tunnel-insulating layer 15 may be, for example, MgO.

The material of the ferromagnetic layer 16 of the memory layer 3 may be a ferromagnetic material, such as CoFeB.

In the memory device 1 of the aforementioned embodiment, the fixed-magnetization layer 2 is formed below the memory layer 3, so the magnetized region of the reference layer 14 having magnetized components in the stacked direction can be arranged below the memory layer 3. Alternatively, the fixed-magnetization layer may he formed above the memory layer and the magnetized region may be above the memory layer.

In the present embodiment, the fixed-magnetization layer 2 includes two layers, ferromagnetic layers 12, 14. However, the number of ferromagnetic layers forming the fixed-magnetization layer 2 is not specifically limited.

For example, in the memory device of the aforementioned embodiment, the number of ferromagnetic layers forming the fixed-magnetization layer may be any number of the layers other than two layers. In this case, the magnetized components in the stacked direction may be caused by applying the current magnetic fields from the metal wiring lines on the ferromagnetic layer arranged on at least a fixed-magnetization layer adjacent to the memory layer 3. As a result, a large spin torque can activate the magnetization of the memory layer. Consequently, the direction of the magnetization M1 of the memory layer 3 can be easily reversed. Thus, the magnetization M1 of the memory layer 3 can be reversed with a small amount of an electric current of the spin-polarized election flow Iz.

In this manner, the consumption electric power of the spin-polarized current Iz can be reduced for the recording of information, thereby reducing power consumption.

For example, even though the fixed-magnetization layer includes only one ferromagnetic layer, current magnetic fields from the metal wiring lines can activate the single ferromagnetic layer to cause magnetized components in the stacked direction. As a result, a spin torque can activate the magnetization of the memory layer.

In addition, for example, three or more ferromagnetic layers may form a fixed-magnetization layer. In the case where the fixed-magnetization layer includes a plurality of ferromagnetic layers, the current magnetic field from the metal wiring line can activate at least a ferromagnetic layer of the fixed-magnetization layer adjacent to the memory layer 3 to generate the magnetized components in the stacked direction. As a result, spin torques can activate the magnetization of the memory layer.

Furthermore, the ferromagnetic layer for generating magnetized components in the stack direction is not limited to the one arranged adjacent to the memory layer 3. The magnetic components in the stacked direction may be formed on another ferromagnetic layer having the fixed-magnetization layer. In addition, a plurality of ferromagnetic layers may be allowed to generate magnetized components in the stacked direction to exert an effect of large spin torque on the magnetization of the memory cell. As a result, the direction of the magnetization M1 of the memory layer 3 can be easily reversed. Thus, the direction of the magnetization M1 of the memory layer 3 can be easily reversed with a small amount of an electric current of the spin-polarized current Iz.

Consequently, the consumption electric power of the spin-polarized current Iz for recording of information can be reduced, thereby decreasing power consumption.

It should be understood that various changes and modifications to the presently preferred embodiments described herein will be apparent to those skilled in the art. Such changes and modifications cart be made without departing from the spirit and scope of the present subject matter and without diminishing its intended advantages. It is therefore intended that such changes and modifications be covered by the appended claims.

The invention is claimed as follows:

1. A memory device, comprising:
    a memory layer retaining information thereon based on a magnetization state of a magnetic body;
    a fixed-magnetization layer having a fixed-magnetization direction formed on the memory layer through a non-magnetic layer; and
    two metal wiring lines formed adjacent to both non-stacked ends of the fixed-magnetization layer, wherein
    the magnetization direction of the memory layer is changed by passing an electric current therethrough in a stacked direction to record the information on the memory layer.

2. The memory device according to claim 1, wherein
    the fixed-magnetization layer includes a plurality of ferromagnetic layers stacked through the non-magnetic layer.

3. The memory device according to claim 1, wherein
    the two metal wiring lines are formed perpendicular to the magnetization direction of the ferromagnetic layer.

4. The memory device according to claim 1, wherein
    the two metal wiring lines are formed in a plane in parallel with the fixed-magnetization layer.

5. The memory device according to claim 1, wherein a second electric current is passed through the two metal wiring lines, the second electric current being separate from the electric current passed through the memory layer.

6. A memory, comprising:
    a memory device including a memory layer retaining information thereon based on a magnetization state of a magnetic body;
    a fixed-magnetization layer having a plurality of ferromagnetic layers and having a fixed-magnetization direction formed on the memory layer through a non-magnetic layer; and
    two metal wiring lines formed adjacent to both non-stacked ends of the fixed-magnetization layer, wherein
    the magnetization direction of the memory layer is changed by passing an electric current therethrough in a stacked direction to record the information on the memory layer, and wherein
    a first and second magnetized regions are formed on both ends of the ferromagnetic layer located at least at the closest side to the memory layer, of the ferromagnetic layers that form the fixed-magnetization layer, by passing an electric current through the two metal wiring lines in the same directions, and the first and second magnetized regions include magnetized components in the stacked directions and the directions thereof are mutually different.

* * * * *